US006552350B2

(12) United States Patent
Haas et al.

(10) Patent No.: US 6,552,350 B2
(45) Date of Patent: Apr. 22, 2003

(54) SYSTEM AND METHOD FOR PROVIDING A LITHOGRAPHIC LIGHT SOURCE FOR A SEMICONDUCTOR MANUFACTURING PROCESS

(75) Inventors: Edwin G. Haas, Sayville, NY (US); Robert M Gutowski, Glen Oaks, NY (US); Vincent S. Calia, Greenlawn, NY (US)

(73) Assignee: Advanced Energy Systems, Inc., Medford, NY (US)

( * ) Notice: Subject to any disclaimer, the term of this patent is extended or adjusted under 35 U.S.C. 154(b) by 238 days.

(21) Appl. No.: 09/760,340

(22) Filed: Jan. 12, 2001

(65) Prior Publication Data

US 2002/0051358 A1 May 2, 2002

Related U.S. Application Data

(62) Division of application No. 09/306,224, filed on May 6, 1999, now Pat. No. 6,190,835.

(51) Int. Cl.[7] ................................................. H05H 1/34
(52) U.S. Cl. ................. 250/365; 250/493.1; 250/492.2; 250/504 R; 250/372
(58) Field of Search ............................ 250/365, 492.2, 250/493.1, 504 R, 372; 315/111.21; 355/53; 430/311

(56) References Cited

U.S. PATENT DOCUMENTS

| 2,949,391 A | 8/1960 | Anderson ................... 148/9 |
| 3,255,966 A | 6/1966 | Hoffert et al. ........... 239/132.3 |
| 4,142,090 A | 2/1979 | Essers et al. ............. 219/121 P |
| 4,371,775 A | 2/1983 | Mihara et al. ........ 219/121 PK |
| 4,634,611 A | 1/1987 | Browning ................... 427/423 |
| 4,644,576 A | 2/1987 | Kuyel ......................... 378/119 |
| 4,663,567 A | 5/1987 | Wong ..................... 315/111.21 |
| 5,062,364 A | 11/1991 | Lewis et al. ................. 101/467 |
| 5,408,066 A | 4/1995 | Trapani et al. .......... 219/121.47 |
| 5,577,092 A | 11/1996 | Kubiak et al. ............... 378/119 |
| 6,065,203 A | 5/2000 | Haas et al. ..................... 29/505 |
| 6,090,711 A | 7/2000 | Batz, Jr. et al. ............. 438/689 |
| 6,180,952 B1 * | 1/2001 | Haas et al. ............... 250/492.2 |
| 6,437,349 B1 * | 8/2002 | Haas et al. ............... 250/492.1 |
| 6,452,194 B2 * | 9/2002 | Bijkerk et al. ........... 250/492.2 |

FOREIGN PATENT DOCUMENTS

| WO | WO 95/25370 | 9/1995 | ............. H01S/3/30 |
| WO | WO 98/34234 | 8/1998 | ............. G21G/4/00 |

OTHER PUBLICATIONS

PCT, International Search Report, Application No. PCT/US 00/12496, Jul. 8, 2000.
Rymell, L., et al, "Debris Elimination in a Droplet–Target Laser–Plasma Soft X–Ray Source," Rev. Sc. Instrum. 66 (10,) Oct. 1995, 1995 American Institute of Physics.
Fiedorowicz, H., et al., "Investigation of Soft X–ray Emission from a Gas Puff Target Irradiated with a Nd:YAG Laser," Optics Communications 163 (1999), pp. 103–114.

* cited by examiner

Primary Examiner—Bruce Anderson
Assistant Examiner—Nikita Wells
(74) Attorney, Agent, or Firm—Fulbright & Jaworski L.L.P.

(57) ABSTRACT

A method for providing a lithographic light source is provided that includes producing a process fluid plume. A coaxial shielding fluid is produced around the process fluid plume. A plasma is generated by providing an energy source that impinges on the process fluid plume.

27 Claims, 2 Drawing Sheets

SYSTEM AND METHOD FOR PROVIDING A LITHOGRAPHIC LIGHT SOURCE FOR A SEMICONDUCTOR MANUFACTURING PROCESS

CROSS REFERENCE TO RELATED APPLICATIONS

This application is a divisional of U.S. application Ser. No. 09/306,224, filed May 6, 1999 now U.S. Pat. No. 6,190,835, by Edwin G. Haas et al. and entitled "System and Method for Providing a Lithographic Light Source for a Semiconductor Manufacturing Process".

TECHNICAL FIELD OF THE INVENTION

This invention relates generally to photolithography in semiconductor manufacturing and more particularly to a system and method for providing a lithographic light source for a semiconductor manufacturing process.

BACKGROUND OF THE INVENTION

Photolithographic fabrication of semiconductor components, such as integrated circuits and dynamic random access memory chips, is customary in the semiconductor industry. In photolithographic fabrication, light may be used to cure or harden a photomask that is used to form a pattern of conductive, semiconductive, and insulative components in the semiconductor layer. The resulting pattern of conductive, semiconductive, and insulative components on the semiconductor layer form extremely small microelectronic devices, such as transistors, diodes, and the like. The microelectronic devices are generally combined to form various semiconductor components.

The density of the microelectronic devices on the semiconductor layer may be increased by decreasing the size or geometry of the various conductive, semiconductive, and insulative components formed on the semiconductor layer. This decrease in size allows a larger number of such microelectronic devices to be formed on the semiconductor layer. As a result, the capability and speed of the semiconductor component may be greatly improved.

The lower limit on the size, often referred to as the line width, of a microelectronic device is generally limited by the wavelength of light used in the photolithographic process. The shorter the wavelength of light used in the photolithographic process, the smaller the line width of the microelectronic device that may be formed on the semiconductor layer. Semiconductor component fabrication may be further improved by increasing the intensity of the light used in the photolithographic process, which reduces the time the photomask material needs to be radiated with light. As a result, the semiconductor components may be produced faster and less expensively.

Extreme ultraviolet (EUV) light has a very short wavelength and is preferable for photolithographic fabrication of semiconductor components. Conventional systems for generating EUV light typically include an energy source impinging on a hard target. The energy source may be a high energy laser, an electron beam, an electrical arc, or the like. The hard target is generally a ceramic, thin-film, or solid target comprising materials such as tungsten, tin, copper, gold, xenon, or the like. Optics, such as mirrors and lenses, are used to reflect and focus the EUV light on a semiconductor layer.

Conventional systems and methods for generating EUV light suffer from numerous disadvantages. One of these disadvantages is that debris from the energy source/target interaction is produced along with the EUV light. The production of debris, which increases with the intensity of the energy source, results in the target being degraded and eventually destroyed. The debris may coat and contaminate the optics and other components of the system, thereby reducing efficiency and performance while increasing frequency of maintenance and length of down time.

Recent improvements in systems and methods for generating EUV light include an energy source impinging on a fluid target. However, these systems and methods also suffer from disadvantages. One disadvantage is the existence of plasma-induced erosion. The energy source impinging on the fluid target produces a plasma which can degrade the external surfaces of the components of the light source. This plasma-induced erosion releases contaminants that must be removed, adding cost and complexity to the system.

Another disadvantage is that the plasma is a major source of high heat loading on the components of the light source. Thermal particle or ion impact from the plasma further adds to the high radiative heat load on the components. This problem is compounded by the fact that the amount of heat that can be removed from the components is limited by their severe geometric restrictions.

Yet another disadvantage is caused by the collection optics needing a direct view of the plasma to collect the light rays being generated. This results in direct plasma interaction on the collection optics which causes erosion. The optics are sensitive to erosion and costly to repair.

SUMMARY OF THE INVENTION

In accordance with the present invention, a system and method for providing a lithographic light source are provided that substantially eliminate or reduce the disadvantages or problems associated with previously developed methods and systems. In particular, the present invention provides a coaxial shielding fluid 360° around a process fluid.

In one embodiment of the present invention, a method for providing a lithographic light source is provided that includes producing a process fluid plume. A coaxial shielding fluid is produced around the process fluid plume. A plasma is generated by providing an energy source that impinges on the process fluid plume.

In another embodiment of the present invention, a method for manufacturing a semiconductor device is provided that includes depositing a photoresist layer over a semiconductor target. A process fluid is produced in a lithographic system. A coaxial shielding fluid is produced around the process fluid. A light is produced by focusing an energy source on the process fluid. A photoresist mask is formed by exposing at least a portion of the photoresist layer to the light.

In a third embodiment of the present invention, a system for providing a lithographic light source is provided that includes an energy source, a fluid system, and an optics system. The fluid system includes a diffuser, a holder assembly, and a nozzle system. The nozzle system is operable to produce a process fluid and a coaxial shielding fluid. The optics system is operable to focus the energy source on the process fluid and to transmit the photolithographic light generated by the plasma onto a semiconductor chip.

Technical advantages of the present invention include providing a coaxial shielding fluid for a lithographic light source. In particular, a coaxial shielding fluid is introduced in the same direction as the process fluid and 360° around the outside of the process fluid outlet. As a result, a minimal quantity of shielding fluid is required and vacuum pumping needs for fluid separation are reduced. Improved shielding is provided because the shielding fluid is relatively dense close to the plasma, increasing the ability of the shielding fluid to absorb kinetic energy from the particles emanating from the plasma. The shielding fluid also reduces the lateral spread of the process fluid plume. This increases the efficiency of the diffuser, thereby lowering pumping costs.

Other technical advantages of the present invention will be readily apparent to one skilled in the art from the following figures, description and claims.

BRIEF DESCRIPTION OF THE DRAWINGS

For a more complete understanding of the present invention and its advantages, reference is now made to the following description taken in conjunction with the accompanying drawings, wherein like numerals represent like parts, in which.

DETAILED DESCRIPTION OF THE INVENTION

FIGS. 1 through 5 illustrate an emitted energy system 10 in accordance with one embodiment of the present invention. As described in more detail below, the emitted energy system 10 may comprise a fluid system 12 and an energy system 14 that interact to produce a beam of emitted energy 16. The emitted energy 16 may be extreme ultraviolet light for use in photolithographic production of microelectronic devices in semiconductor components. The extreme ultraviolet light allows the economical fabrication of microelectronic devices having line widths smaller than 100 nanometers. Accordingly, the emitted energy system 10 increases the number of microelectronic devices that may be placed on a semiconductor layer, thereby increasing the potential capability and speed of a semiconductor component, such as an integrated circuit chip, memory chip, or the like.

Figure 1:
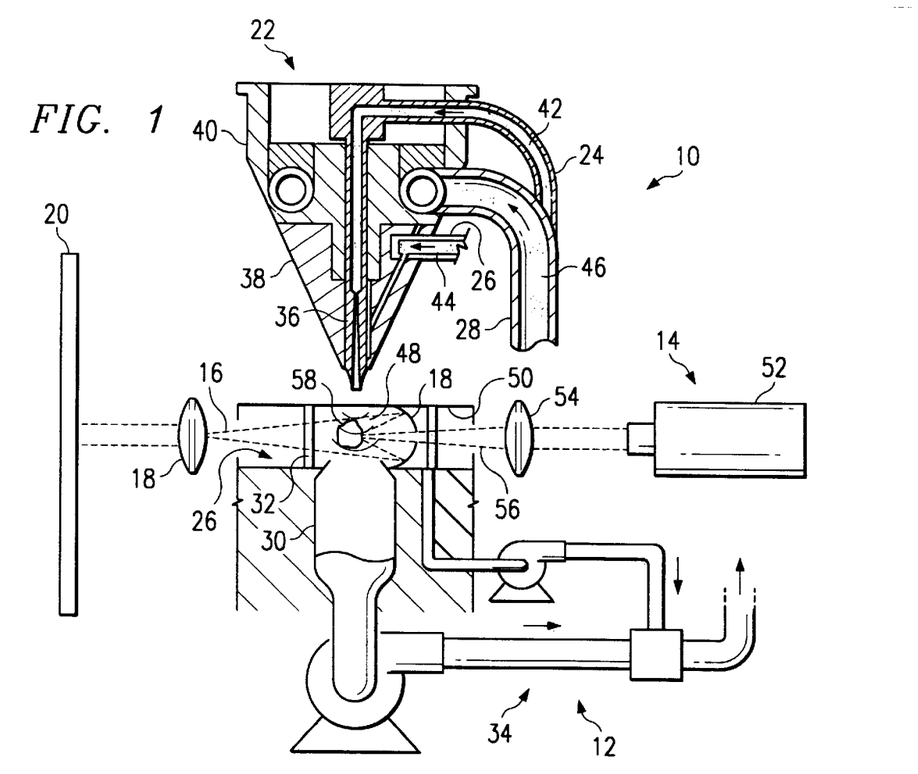
FIG. 1 is a drawing in section with portions broken away illustrating an emitted energy system in accordance with one embodiment of the present invention.

FIG. 1 is a block diagram illustrating an emitted energy system 10 in accordance with one embodiment of the present invention. In this embodiment, the emitted energy system 10 may be used to generate extreme ultraviolet light for use in photolithography. It will be understood that the emitted energy system 10 may be otherwise used without departing from the scope of the present invention. For example, the emitted energy system 10 may be used to produce other wavelengths of light and may be used in welding, machining, chemistry applications, biological research, materials research, communication systems, and the like. In addition, the emitted energy system 10 may be used in a combustion chamber to enhance burning or provide useful burning characteristics by supplying fuel, catalyst, oxygen or other substances.

Referring to FIG. 1, the lithographic light source system or emitted energy system 10 comprises a fluid system 12 and an energy system 14 that interact to generate an emitted energy 16. The emitted energy 16 may be collected and directed by an output optics 18 to a target 20. It will be understood that the emitted energy system 10 may include other suitable components without departing from the scope of the present invention.

According to one embodiment, the fluid system 12 includes a nozzle system 22, a process fluid supply line 24, a shielding fluid supply line 26 and a heat exchange fluid supply line 28 supply line 28. The fluid system 12 may also comprise a diffuser 30, a holder assembly 32 and a fluid removal system 34.

The nozzle system 22 comprises a nozzle 36, a shell 38 and a heat exchanger 40. The process fluid supply line 24 supplies a process fluid 42 to the nozzle 36. The process fluid 42 is generally gaseous in form as it flows through the nozzle 36. In one embodiment, the process fluid 42 is a noble gas such as xenon. Alternatively, the process fluid 42 is iodine, sodium, other noble gases such as argon or helium, or other suitable material.

The shielding fluid supply line 26 supplies a shielding fluid 44 to the shell 38. The shielding fluid 44 is also generally gaseous in form as it flows through the shell 38. In one embodiment, the shielding fluid 44 is a noble gas such as helium, a relatively inert gas such as nitrogen, or a gas mixture comprising a noble or inert gas. It will be understood that the process fluid 42 and the shielding fluid 44 may be any materials or combinations of materials that produce the desired emitted energy 16 during the interaction of the fluid system 12 and the energy system 14 without departing from the scope of the present invention.

The heat exchange fluid supply line 28 supplies a heat exchange fluid 46 to the heat exchanger 40. In one embodiment, the heat exchange fluid 46 is a refrigerant such as HFE-7100 from 3M Specialty Chemicals or, alternatively, liquid nitrogen. However, it will be understood that the heat exchange fluid 46 may be any other refrigerant or other material or combination of materials that are capable of exchanging heat with the nozzle system 22 to maintain a desired operating temperature range.

The process fluid 42 flows through the nozzle system 22 and is discharged in a fluid plume 48. A coaxial shielding fluid 44 flows from the shell 38 of the nozzle system 22 such that the shielding fluid 44 flows 360° around and in the same direction as the process fluid 42 being discharged from the nozzle 36.

In general, the fluid plume 48 is formed within a chamber 50. The chamber 50, may be evacuated to a hard vacuum on the order of one millitorr. It will be understood that the chamber 50 may be otherwise evacuated without departing from the scope of the present invention.

In one embodiment, the chamber 50 captures the process fluid 42 exiting the nozzle system 22. In another embodiment, the diffuser 30 captures substantially all of the process fluid 42 in the fluid plume 48. In this embodiment, the holder assembly 32 operates to maintain precise alignment between the nozzle system 22 and the diffuser 30 to optimize operation of the diffuser 30 such that the fluid plume 48 is substantially captured by the diffuser 30. This is accomplished more efficiently by utilizing shielding fluid 44 to reduce the lateral spread of the fluid plume 48. It will be understood that the process fluid 42 may be otherwise captured without departing from the scope of the present invention.

According to one embodiment, the fluid system 12 includes a fluid removal system 34 that operates to remove the captured process fluid 42. The captured process fluid 42 may then be recirculated back to the process fluid supply line 24 for reuse. In one embodiment, the fluid removal system 34 is coupled to the chamber 50. In another embodiment, the fluid removal system 34 is coupled to the diffuser 30 and the chamber 50. It will be understood that the fluid removal system 34 may be otherwise configured without departing from the scope of the present invention.

In operation, the process fluid supply line 24 may provide pressurized process fluid 42 in the form of a gas, liquid, or mixture to the nozzle 36. The pressurized process fluid 42 flows through the nozzle 36. The discharge, or exit, of the process fluid 42 from the nozzle 36 forms the fluid plume 48 in the chamber 50. The process fluid 42 forming the fluid plume 48 is collected and removed by the fluid removal system 34. The fluid removal system 34 may compress, cool, and filter the process fluid 42 before returning the process fluid 42 to the process fluid supply line 24. The process fluid 42 may then be circulated back to the nozzle 36 for reuse.

According to one embodiment, the fluid removal system 34 operates to remove the shielding fluid 44, as well as the process fluid 42. The captured shielding fluid 44 may then be recirculated back to the shielding fluid supply line 26 for reuse. In this embodiment, the fluid removal system 34 separates the process fluid 42 from the shielding fluid 44 before recirculating the fluids 42 and 44 for reuse.

The fluid flow characteristics of the process fluid 42 in the fluid plume 48 are strictly controlled and substantially defined by the design of the nozzle 36. The design of the nozzle 36 generally controls the quantity of the process fluid 42 being discharged, the average size of clustered gas atoms or molecules of the process fluid 42 in the fluid plume 48, the velocity of the process fluid 42, and the temperature of the process fluid 42, as well as the size and shape of the fluid plume 48. These flow characteristics may individually and in combination affect the operation of the emitted energy system 10.

The process fluid 42 discharged from the nozzle 36 may be subsonic or supersonic. In one embodiment, the process fluid 42 in the fluid plume 48 flows at a velocity between Mach 5 and Mach 10. In the embodiment in which the process fluid 42 comprises xenon, the velocity of the process fluid 42 is approximately 300 meters/second. As discussed in detail below, the nozzle 36 may be designed to allow the atoms or molecules of the process fluid 42 to cluster. Clustering of the process fluid 42 increases the average particle size of the clustered atoms or molecules of the process fluid 42 in the fluid plume 48. The clustered atoms or molecules of the process fluid 42 in the fluid plume 48 may have an optimum cluster size or optimum total density per unit area at the plasma 58 region which may increase the quantity of the emitted energy 16 produced during the interaction of the fluid system 12 and the energy system 14. Accordingly, the efficiency of the emitted energy system 10 is increased. Additionally, the emitted energy system 10 produces a relatively debris-free emitted energy 16 of a particular wavelength, or wavelengths, at an intensity that may be used in photolithography fabrication processes.

As illustrated in FIG. 1, the energy system 14 interacts with the fluid plume 48 within the chamber 50 to produce the emitted energy 16. The fluid removal system 34 is used to evacuate the chamber 50 to a very low vacuum pressure and to remove any contaminates from the chamber 50. Contaminates may include any atoms, molecules, ions, and material particulate contained within the chamber 50 that may degrade or interfere with the operation of the emitted energy system 10.

The energy system 14 may include an energy source 52 and an input optics 54 that are used in connection with the chamber 50 and the fluid plume 48 to generate the emitted energy 16. The energy source 52 and input optics 54 operate to produce an input energy 56 that excites the process fluid 42 in the fluid plume 48 into producing the emitted energy 16. The energy source 52 and the input energy 56 are often dependent upon the process fluid 42 used in the emitted energy system 10. In an embodiment in which the process fluid 42 comprises xenon and the input energy 56 is a high power laser beam having a wavelength of approximately 1.064 microns, the emitted energy 16 is extreme ultraviolet light that may be used in photolithography production of semiconductor components. In this embodiment, the input energy 56 is produced by a Nd:YAG laser. It will be understood that the input energy 56 may be otherwise produced and be any other suitable energy that excites the process fluid 42 into producing the desired wavelength(s) of the emitted energy 16 without departing from the scope of the present invention. For example, the input energy 56 may be an electric arc, an ion or electron beam, a coherent light such as a laser beam having different wavelengths, microwaves, or any other suitable energy.

The input energy 56 may be focused through the input optics 54 into the fluid plume 48 to form a plasma 58 that produces the emitted energy 16. The input energy 56 may be directed into the fluid plume 48 such that the quantity of the emitted energy 16 reabsorbed by the process fluid 42 is minimized. Thus, the input energy 56 may be focused on the fluid plume 48 proximate the nozzle 36 such that the distance the emitted energy 16 travels through the fluid plume 48 is minimized. Some suitable types of input energy 56, such as an electric arc, do not require input optics 54. It will be understood that the present invention includes such types of input energy 56.

In one embodiment, the input optics 54 may be a system of mirrors and lenses that collect, transmit, and focus the input energy 56 into the fluid plume 48. It will be understood that the input optics 54 may be any suitable device or system for collecting, transmitting, or directing the input energy 56 into the fluid plume 48 without departing from the scope of the present invention.

According to one embodiment, the shielding fluid 44 is transparent to the emitted energy 16 and is able to absorb kinetic energy from the plasma 58. The shielding fluid 44 is also transparent to the input energy 56 in order to allow adequate transmission of the input energy 56 to the process fluid 42 for forming the plasma 58. The shielding fluid 44 is distributed such that the highest density of the shielding fluid 44 is located between the plasma 58 and the output optics 18. Thus, the shielding fluid 44 is relatively dense close to the plasma 58 in order to increase the ability of the shielding fluid 44 to absorb kinetic energy from the energetic particles emanating from the plasma 58 while minimizing the amount of shielding fluid 44 required. The minimized amount of shielding fluid 44 reduces the vacuum pumping needs for separating the shielding fluid 44 from the process fluid 42. The shielding fluid 44 also reduces the lateral spread of the fluid plume 48 which increases the efficiency of the diffuser 30 in its collection of the fluid plume 48.

The emitted energy 16 may be collected and directed by the output optics 18 to the target 20. In general, the output optics 18 will be arranged proximate the input energy 56, as the greatest intensity of the emitted energy 16 is produced proximate the input energy 56. In one embodiment, the output optics 18 may include a mirror system which substantially surrounds one end of the holder assembly 32 to reflect the emitted energy 16 through a system of mirrors and lenses. It will be understood that the output optics 18 may be any suitable device or system for collecting, transmitting, or directing the emitted energy 16 to the target 20 without departing from the scope of the present invention.

The target 20 may be any material or system to which the emitted energy 16 is directed. In one embodiment, the target 20 is a photolithography system interface used in the photolithographic production of electronic devices. Other embodiments may utilize the emitted energy 16 in relatively simple applications such as welding or manufacturing, or in more complicated applications such as applied physics research, materials research, biological research, communications systems, and the like.

In short, the emitted energy system 10 allows the economical and debris-free production of an emitted energy 16. The emitted energy 16 is produced in a manner that is reduces contamination of the components of the emitted energy system 10. For example, the process fluid 42 used to produce the emitted energy 16 is not damaged or destroyed by operation of the emitted energy system 10. In addition, the input optics 54 and output optics 18, along with the surfaces of the diffuser 30, nozzle system 22, chamber 50, and holder assembly 32 do not require the same level of maintenance and cleaning as required in conventional systems for producing an emitted energy 16. Furthermore, maintenance, cleaning and replacement of the nozzle system 22 components (the nozzle 36, the shell, 38 and the heat exchanger 40) are less costly because the components 36, 38 and 40 are individually removable and replaceable. Thus, if a component 36, 38 or 40 requires maintenance or cleaning, or if erosion or other detrimental condition renders a component 36, 38 or 40 unusable: or reduces its effectiveness, the individual component 36, 38 or 40 may be removed and repaired, cleaned or replaced as necessary. The remaining, functioning components 36, 38 and/or 40 may then continue to be utilized until they require maintenance, cleaning or replacement.

In photolithographic applications, the emitted energy system 10 preferably produces extreme ultraviolet light at high intensity. The high intensity ultraviolet light attainable with the present invention facilitates the cost-effective fabrication of semiconductor devices that have microelectronic device features with line widths of 100 nanometers or less. The emitted energy system 10 also allows a greater number of microelectronic devices to be placed within the semiconductor device, which results in a corresponding increase in the capability and speed of the semiconductor device.

In one photolithographic embodiment, the emitted energy system 10 is used in the fabrication of a semiconductor device, such as an integrated circuit, memory chip, application specific integrated circuit, or the like. A photolithography system may include a mask and a semiconductor target 20. The mask allows only a portion of the emitted energy 16 incident upon the mask to reach the semiconductor target 20. The mask includes a mask pattern such that the portion of the emitted energy 16 which reaches the semiconductor target 20 is in a pattern corresponding to the mask pattern. In other words, by screening the emitted energy 16 incident upon the mask, the mask operates to replicate the mask pattern onto the semiconductor target 20.

The semiconductor target 20 may comprise a substrate covered by a photoresist layer. The substrate may be a semiconductor such as a wafer formed from a single-crystalline silicon material, an epitaxial semiconductor layer, a polycrystalline semiconductor material, or a metal such as aluminum, tungsten, or copper, or any other such suitable material. It will be understood that the substrate may comprise other suitable materials and layers without departing from the scope of the present invention.

The photoresist layer may be any suitable material that reacts to the emitted energy 16. For example, the photoresist layer may react to the emitted energy 16 by curing, hardening, or positive or negative polymerization. In one embodiment, the photoresist layer comprises extreme ultraviolet photoresist material. It will be understood that the photoresist layer may be other suitable photo-reacting material without departing from the scope of the present invention.

A photoresist mask is formed within the photoresist layer by exposing the photoresist layer to a pattern of emitted energy 16 such that the portion of the photoresist layer exposed to the emitted energy 16 reacts to the emitted energy 16 by curing, hardening, polymerizing, or the like. The unreacted portion of the photoresist layer is then removed, exposing a portion of the underlying substrate. The remaining portion of the photoresist layer forms the photoresist mask.

In operation, a photolithography system receives the emitted energy 16 from the output optics 18 and directs the emitted energy 16 toward the mask. The mask screens the emitted energy 16 such that a pattern of the emitted energy 16 is directed toward the photoresist layer of the semiconductor target 20. The portion of the photoresist layer upon which the emitted energy 16 is incident reacts to the emitted energy 16. The unreacted portion of the photoresist layer is then removed to expose a portion of the underlying substrate. The remaining portion of the photoresist layer forms the photoresist mask in a pattern corresponding to the mask pattern in the mask.

Semiconductor fabrication processes such as wet etching, dry etching, ion implantation, or other suitable processes may then be performed on the exposed substrate to form a structure, such as a gate, source/drain, moat, or other component of a microelectronic device. For example, the substrate may be subjected to an ion implantation process such that a source region and a drain region for a transistor are formed. The substrate could also be subjected to a plasma-based etch process, such as a reactive ion etch, that anisotropically etches the substrate to form an element of a transistor such as a gate or a sidewall body.

Figure 2A:
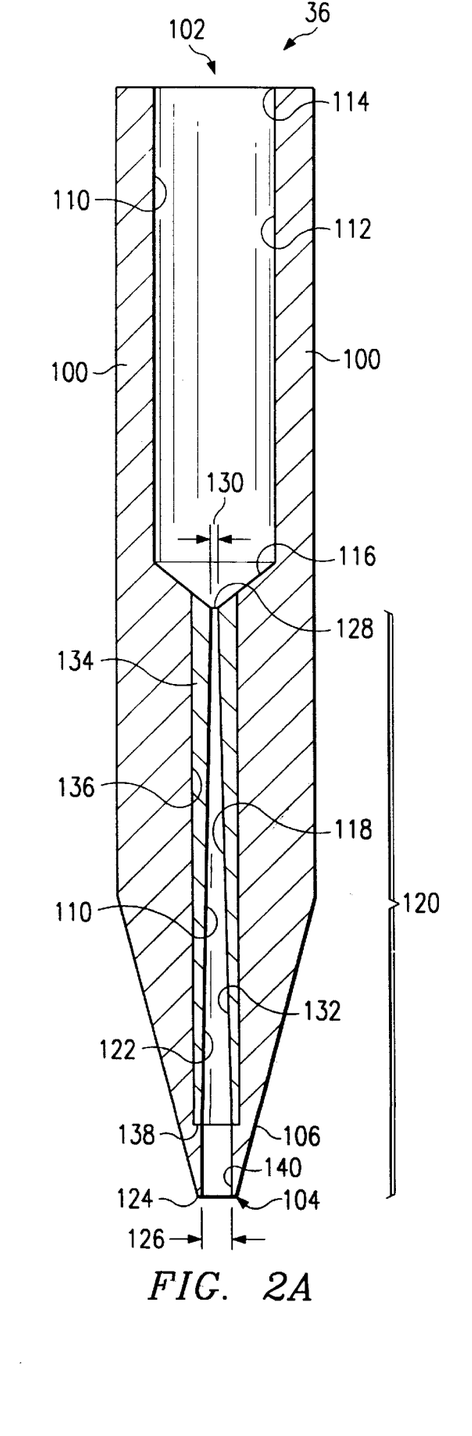
FIG. 2A is a cross-section illustrating a nozzle in accordance with one embodiment of the present invention.

FIG. 2A is a cross-section illustrating a nozzle 36 in accordance with one embodiment of the present invention. In this embodiment, the nozzle 36 discharges process fluid 42 for use in generating the fluid plume 48. It will be understood that the nozzle 36 may be otherwise used without departing from the scope of the present invention.

According to one embodiment, the nozzle 36 includes a generally cylindrical nozzle body 100 having an upstream end 102 and a downstream end 104. The nozzle body 100 may be tapered adjacent to the downstream end 104 of the nozzle body 100 to form a nozzle tip 106. It will be understood that the nozzle body 100 may be otherwise shaped and configured without departing from the scope of the present invention.

A nozzle cavity 110 is disposed within the nozzle body 100 between the upstream end 102 and the downstream end 104. The nozzle cavity 110 may comprise stainless steel, graphite, or other suitable material. The nozzle cavity 110 may include an inlet passage 112 defined within the upstream end 102 of the nozzle cavity 110. The upstream end 102 of the inlet passage 112 may form an inlet 114. The downstream end 104 of the inlet passage 112 may form a transition passage 116. The inlet passage 112 and transition passage 116 may include a diverging, converging, or straight passage, or any suitable combination thereof.

In one embodiment, the inlet passage 112 is a straight, generally cylindrical passage. In this embodiment, the transition passage 116 is converging toward the downstream end 104. It will be understood that the inlet passage 112 may be otherwise shaped or configured without departing from the scope of the present invention.

The nozzle cavity 110 also includes a nozzle passage 118 defined within the downstream end 104 of the nozzle cavity 110. The nozzle passage 118 may have an associated longitudinal length 120. In one embodiment, the longitudinal length 120 of the nozzle passage 118 is between 0.1 and 1.0 inches. In a particular embodiment, the longitudinal length 120 of the nozzle passage 118 is approximately 0.5 inches. In another embodiment, the longitudinal length 120 is sized to allow the particles of process fluid 42 to cluster. It will be understood that the longitudinal length 120 may be otherwise sized without departing from the scope of the present invention.

The nozzle passage 118 may also include a taper 122. In one embodiment, the taper 122 forms a diverging passage from the upstream end 102 to the downstream end 104 of the nozzle cavity 110. The taper 122 may be between 1 and 30°. In a particular embodiment, the taper 122 is approximately 6°. It will be understood that the nozzle passage 118 may be otherwise tapered without departing from the scope of the present invention. For example, the taper 122 may be linear, non-linear, symmetric (i.e., conical) or non-symmetric (i.e., rectangular) and may contain diverging, converging, or straight passages, or any suitable combination thereof.

The downstream end 104 of the nozzle passage 118 forms an outlet 124. A diameter or average width 126 is associated with the outlet 124. In one embodiment, the associated width 126 of the outlet 124 is between 0.002 and 0.086 inches. In a particular embodiment, the associated width 126 of the outlet 124 is on the order of 0.0044 inches. It will be understood that the outlet 124 may be otherwise sized without departing from the scope of the present invention.

In another embodiment, the width 126 of the outlet 124 may be substantially less than the longitudinal length 120 of the nozzle passage 118. In one embodiment, the width 126 of the outlet 124 is less than the longitudinal length 120 of the nozzle passage 118 by a factor of at least 10. In a particular embodiment, the width 126 of the outlet 124 is less than the longitudinal length 120 of the nozzle passage 118 by a factor of approximately 20. It will be understood that the longitudinal length 120 of the nozzle passage 118 may be otherwise varied relative to the width 126 of the outlet 124 without departing from the scope of the present invention.

The transition between the transition passage 116 and the nozzle passage 118 may form a throat 128. The throat 128 has a diameter or average width 130 associated with the throat 128. In one embodiment, the throat 128 has a width 130 less than 0.02 inches. In a particular embodiment, the throat 128 has an average width 130 of approximately 0.001 inches. It will be understood that the throat 128 may be otherwise sized without departing from the scope of the present invention. It will be further understood that the nozzle passage 118 may be otherwise configured without departing from the scope of the present invention. For example, the nozzle passage 118 may include other diverging, converging, or straight passages, or any suitable combination thereof.

In accordance with one aspect of the present invention, the nozzle passage 118 may be defined, at least in part, by an internal surface 132 of a miniature tube insert 134. The miniature tube insert 134 may be disposed in the nozzle cavity 110 between the inlet passage 112 and the downstream end 104 of the nozzle body 100. In particular, the miniature tube insert 134 may be disposed in a tube passage 136 formed in the nozzle cavity 110. The tube passage 136 may be generally cylindrical in shape to frictionally receive the miniature tube insert 134. In addition, the tube passage 136 may have a diameter greater than the width 126 of the outlet 124 in order to form a stop 138 for securing the miniature tube insert 134 in the nozzle body 100 during operation. The nozzle cavity 110 may also include a small bore passage 140 fabricated between the tube passage 136 and the downstream end 104 of the nozzle body 100. It will be understood that the miniature tube insert 134 and the tube passage 136 may be otherwise fabricated and configured without departing from the scope of the present invention. In an alternative embodiment, the nozzle body 100 may be one piece, composed entirely of graphite, nickel, stainless steel, or other material with no miniature tube insert 134. In this embodiment, the outside nozzle tip 106 and nozzle body 100 surfaces as well as the inside fluid flow surfaces 112, 116, 132 and 140 are essentially the same as in FIG. 2A.

In operation, the pressurized process fluid 42 enters the nozzle 36 at the inlet 114. The process fluid 42 flows through the transition passage 116 portion of the inlet passage 112 which may be converging for a short distance. As described in more detail below in connection with FIG. 5, the nozzle 36 is generally cooled to help maintain the temperature of the process fluid 42. The process fluid 42 passes through the throat 128 and into the nozzle passage 118 that is diverging. The diverging nozzle passage 118 allows the process fluid 42 flowing through the nozzle passage 118 to expand, thereby further decreasing the temperature and pressure of the process fluid 42. As the temperature and pressure of the process fluid 42 decrease, the density of the process fluid 42 flowing through the diverging nozzle passage 118 decreases. The longitudinal length 120 of the diverging nozzle passage 118 is sufficient to produce clustering of the cooled process fluid 42 flowing through the nozzle 36. Clustering is the clumping together of the atoms or molecules in the process fluid 42, thereby increasing the particle size of the individual fluid particles within the clustered process fluid 42 forming the fluid plume 48. This clustering facilitates the successful implementation of the emitted energy system 10 as a light-generating source.

The process fluid 42 exits the outlet 124 of the nozzle 36 at a high speed, generally at supersonic velocities. In one embodiment, the velocity of the process fluid 42 exiting the outlet 124 is approximately Mach 3. The high speed process fluid 42 exiting the outlet 124 contains the clustered process fluid 42 which forms the fluid plume 48. As discussed previously, the input energy 56 may be directed into the fluid plume 48 to form the plasma 58. The plasma 58 may produce the emitted energy 16 that is collected and directed by the output optics 18 onto the target 20.

The nozzle 36 should be of smooth and regular internal contour to allow unimpeded flow of the process fluid 42. In addition, the longitudinal length and the taper of the nozzle passage 118 cools the process fluid 42 and allows sufficient time for the fluid particles to cluster. Accordingly, the fluid plume 48, may have fluid characteristics that are optimal for producing the emitted energy 16 in response to the input energy 56. Moreover, the size and shape of the fluid plume 48 are strictly controlled and defined. Accordingly, the optimal location for directing the input energy 56 into the fluid plume 48 can be accurately determined to maximize the intensity of emitted energy 16 produced.

Figure 2B:
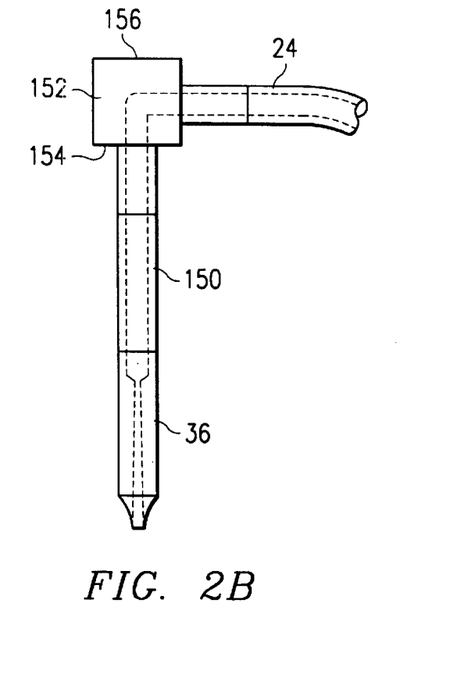
FIG. 2B is a block diagram illustrating the nozzle of FIG. 2A in accordance with one embodiment of the present invention.

FIG. 2B is a block diagram illustrating a nozzle 36 in accordance with one embodiment of the present invention. In this embodiment, the nozzle 36 is coupled to an intermediate tube 150. The intermediate tube 150 is coupled to an elbow 152. It will be understood that any suitable number of intermediate tubes 150 may be coupled to each other between the nozzle 36 and the elbow 152. In this embodiment, the elbow 152 provides a 90 degree angle between a first end 154 and a second end 156. It will be understood that the elbow 152 may provide other suitable angles between the first end 154 and the second end 156. In this embodiment, the first end 154 of the elbow 152 is coupled to the intermediate tube 150, and the second end 156 of the elbow 152 is coupled to the process fluid supply line 24. Thus, the nozzle 36 is coupled to the process fluid supply line 24 through the intermediate tube 150 and the elbow 152. This embodiment may be used to avoid interference or obstruction in applications where space is limited. In an alternative embodiment, the nozzle 36 may be directly coupled to the process fluid supply line 24 without utilizing an intermediate tube 150 or an elbow 152.

Figure 3:
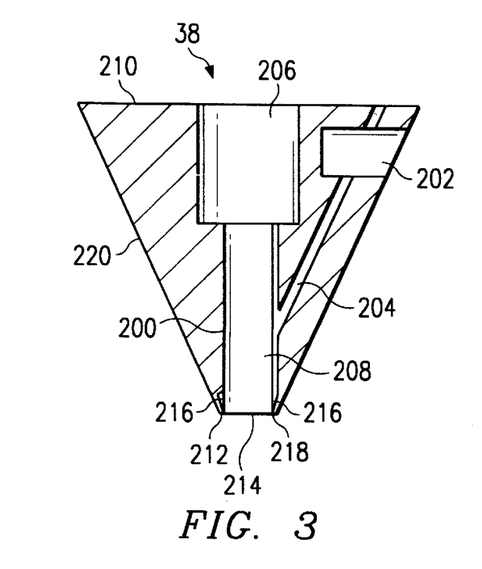
FIG. 3 is a cross-section illustrating a shell in accordance with one embodiment of the present invention.

FIG. 3 is a cross-section illustrating a shell 38 in accordance with one embodiment of the present invention. The shell 38 comprises a shell cavity 200, a supply line receptacle 202 and a shielding fluid passage 204. The shell cavity 200 comprises an upper shell cavity 206 for receiving a portion of the nozzle 36 and/or an intermediate tube 150, as well as a portion of the heat exchanger 40. The shell cavity 200 also comprises a lower shell cavity 208 for receiving another portion of the nozzle 36. In accordance with this embodiment, both the upper shell cavity 206 and the lower shell cavity 208 are straight, generally cylindrical passages. It will be understood, however, that the shell cavities 206 and 208 may be converging, diverging, or straight passages, or any suitable combination thereof. The upper shell cavity 206 extends from an upper face 210 of the shell 38 to the lower shell cavity 208. The lower shell cavity 208 extends from the upper shell cavity 206 to a lower face 212 of the shell 38. A shell opening 214 is formed where the lower shell cavity 208 meets the lower face 212.

The supply line receptacle 202 receives the shielding fluid supply line 26. The shielding fluid supply line 26 may be secured within the supply line receptacle 202 by soldering, brazing, epoxy, chemical sealant, o-rings, or other suitable securing method. By way of the supply line receptacle 202, shielding fluid 44 may be passed from the shielding fluid supply line 26 to the shielding fluid passage 204. According to one embodiment, the shielding fluid passage 204 may extend from the upper face 210 of the shell 38 through the supply line receptacle 202 and down to a plenum region 216. The shielding fluid passage 204 passes the shielding fluid 44 to the plenum region 216 where it exits the shell 38 through a discharge orifice 218 formed at the lower face 212 of the shell 38. The shielding fluid 44 exits the discharge orifice 218 of the shell 38 at a high speed, generally at supersonic velocities. In one embodiment, the velocity of the shielding fluid 44 exiting the discharge orifice 218 is between Mach 5 and Mach 10. In the embodiment in which the shielding fluid 44 comprises helium, the velocity of the shielding fluid 44 is approximately 1,500 meters/second.

The shell 38 also comprises an outer surface 220. According to one embodiment, the outer surface 220 may be tapered from the upper face 210 to the lower face 212 of the shell 38. The shell 38 may be formed of an erosion-resistant material such as internally-sealed graphite, tungsten graphite, other refractory material or high temperature metal, or other suitable material.

Figure 4:
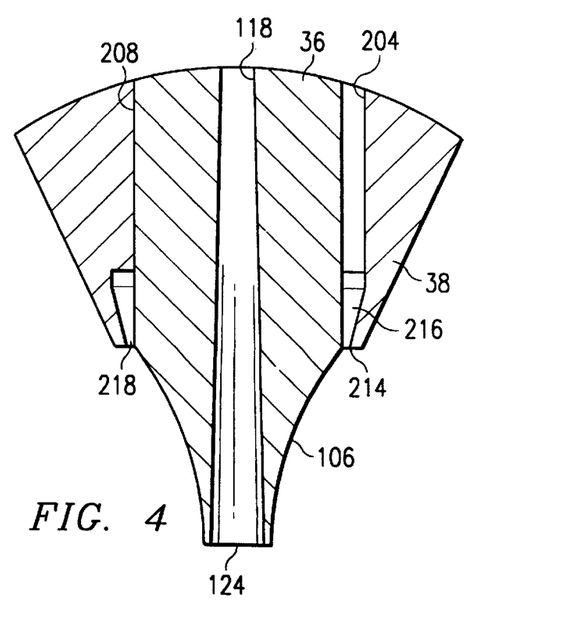
FIG. 4 is a cross-section illustrating a detail view of the nozzle of FIG. 2A and the shell of FIG. 3 in accordance with.one embodiment of the present invention.

FIG. 4 is a cross-section illustrating a detail view of portions of the nozzle 36 and the shell 38 in accordance with one embodiment of the present invention. The downstream end 104 of the nozzle 36 is illustrated within the lower cavity 208 of the shell 38. The nozzle tip 106 extends through the shell opening 214. In this embodiment, the shielding fluid passage 204 is adjacent to the nozzle 36 and runs substantially parallel to the nozzle 36. The shielding fluid passage 204 passes the shielding fluid 44 to the plenum region 216 from which the shielding fluid 44 exits the shell 38 through the discharge orifice 218. In this embodiment, the discharge orifice 218 is annular and extends 360° around the nozzle 36.

In operation, the process fluid 42 flows from the nozzle passage 118 through the outlet 124, while the shielding fluid 44 flows from the plenum region 216 through the discharge orifice 218. As a result, the shielding fluid 44 is discharged in the same direction as the process fluid 42 and 360° around the outlet 124. This allows the shielding fluid 44 to be relatively dense near the plasma 58 which increases absorption of kinetic energy emanating from the plasma 58. In addition, introducing the shielding fluid 44 in this manner reduces the lateral spread of the fluid plume 48, thus increasing the density. This increases the efficiency of the diffuser 30 as well as the efficiency of the emitted energy conversion.

Figure 5:
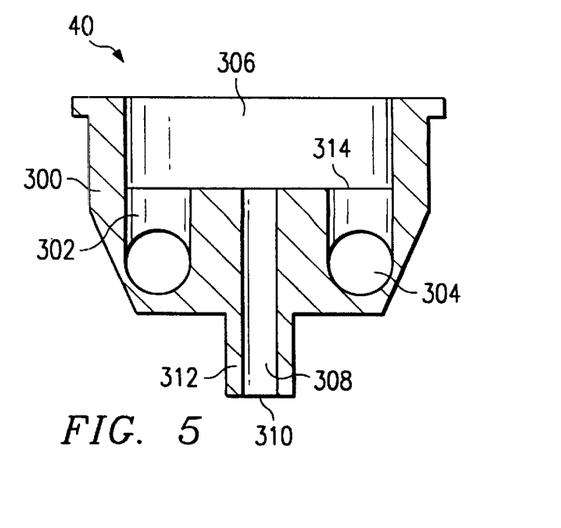
FIG. 5 is a cross-section illustrating a heat exchanger in accordance with one embodiment of the present invention.

FIG. 5 is a cross-section illustrating a heat exchanger 40 in accordance with one embodiment of the present invention. The heat exchanger 40 maintains the temperature of the nozzle system 22 precisely within a specified range by circulating a heat exchange fluid 46 through the heat exchanger 40. According to one embodiment, the heat exchange fluid 46 maintains the temperature of the nozzle throat 128 to maintain the process fluid 42 at or near saturation to avoid clogging. Currently, the preferred nozzle throat temperature is approximately 240 Kelvin.

The heat exchanger 40 comprises a housing 300 and a cap 302. The housing 300 and the cap 302 together form a heat exchange fluid passage 304. In one embodiment, the heat exchange fluid passage 304 may comprise a loop of tube brazed or otherwise conductively coupled between the housing 300 and the cap 302. Alternatively, the heat exchange fluid passage 304 may comprise an integral passage formed in the housing 300. In the embodiment shown in FIG. 5, the heat exchange fluid passage 304 is a generally circular tube. It will be understood, however, that the heat exchange fluid passage 304 may be formed in any other suitable configuration. The heat exchange fluid supply line 28 is coupled to the heat exchange fluid passage 304. Heat exchange fluid 46 is passed from the heat exchange fluid supply line 28 into the heat exchange fluid passage 304 where the heat exchange fluid 46 controls the temperature of the nozzle 36 and the shell 38.

The heat exchanger 40 may also comprise an upper cooling cavity 306 in addition to a lower heat exchange cavity 308. According to the embodiment described in connection with FIG. 2B, the upper cooling cavity 306 receives the process fluid supply line 24 and the elbow 152, as shown in FIG. 1. An additional cooling jacket or heat exchanger (not shown) may partially or fully occupy this volume, or may be thermally connected to the process fluid supply line 24 just upstream of the nozzle 36 to accurately control the process fluid 42 temperature independently of the nozzle 36 temperature. The lower heat exchange cavity 308 receives any intermediate tubes 150 and a portion of the nozzle 36. The remainder of the nozzle 36 extends through a lower heat exchange cavity outlet 310. In addition, a lower portion 312 of the housing 300 is received in the upper shell cavity 206 of the shell 38.

The nozzle 36, the process fluid supply line 24 and any intermediate tubes 150 or elbow 152 may be held within the cavities 306 and 308 by sizing the components 36, 24, 150 and/or 152 to fit tightly within the cavities 306 and 308. Alternatively, a clamping mechanism may be used or a coating of resin, thermoplastic epoxy, or other material suitable for facilitating heat transfer may be used between the components 36, 24, 150 and/or 152 and the cavities 306 and 308. In the embodiment in which a 90 degree elbow 152 is used, a gap may be left between the elbow 152 and an upper surface 314 of the cap 302 for adjustment purposes. The gap may be filled with shims in order to set the discharge orifice 218 between the nozzle 36 and the shell 38 according to the shielding fluid 44 flow requirements.

In operation, the heat exchanger 40 may have to add or remove heat as necessary to keep the nozzle 36 warm enough so that the nozzle 36 does not clog and cool enough to allow proper process fluid 42 temperature at the nozzle throat 128, considering the cooling effect from the expanding shielding fluid 44 as it exits the discharge orifice 218. The housing 300, cap 302 and heat exchange fluid supply line 28 are brazed, soldered, or otherwise suitably coupled together such that the heat exchange fluid 46 may conductively and radiatively remove heat from the nozzle 36 and the shell 38. A layer of resin, thermoplastic or thermosetting epoxy, indium, solder, braze, or other material suitable for facilitating conductive heat transfer may be applied at the faying surfaces between the shell 38 and the heat exchanger 40. In one embodiment, shims may also be used between the shell 38 and the heat exchanger 40.

In operation, heat exchange fluid 46 flows through the heat exchange fluid supply line 28 into the heat exchanger 40 until the nozzle system 22 stabilizes at a desired nozzle 36 temperature. In one embodiment, the desired nozzle 36 temperature is approximately 240 Kelvin. A thermocouple may be placed in the heat exchanger 40 to provide a temperature feedback reading. According to one embodiment, the thermocouple may be placed near the throat 128 of the nozzle 36 or any other suitable location such that interference with fluid conditions is minimized. The process fluid 42 and shielding fluid 44 are adjusted to the desired pressures and/or flow conditions to yield a well-defined central process fluid 42 flow shielded within an outer coaxial shielding fluid 44.

Although the present invention has been described with several embodiments, various changes and modifications may be suggested to one skilled in the art. It is intended that the present invention encompass such changes and modifications as fall within the scope of the appended claims.

What is claimed is:

1. A method for providing a lithographic light source, comprising:
   producing a process fluid plume;
   producing a coaxial shielding fluid around the process fluid plume; and
   generating a plasma by providing an energy source that impinges on the process fluid plume.

2. The method of claim 1, wherein the coaxial shielding fluid extends substantially 360° around the process fluid plume.

3. The method of claim 1, wherein the coaxial shielding fluid is substantially transparent to the energy source.

4. The method of claim 1, wherein the process fluid plume and the coaxial shielding fluid flow at supersonic velocities.

5. The method of claim 1, wherein the process fluid plume comprises xenon and the shielding fluid comprises helium.

6. The method of claim 1, further comprising:
   controlling a flow of the process fluid plume and a flow of the shielding fluid with a nozzle system; and
   circulating a fluid for maintaining a temperature of the nozzle system.

7. The method of claim 6, wherein a heat exchange fluid circulates upstream of a throat of the nozzle system to maintain the temperature of the process fluid at the nozzle throat.

8. A system for providing a lithographic light source, comprising:
   a fluid system, comprising
      a diffuser,
      a holder assembly, and
      a nozzle system operable to produce a process fluid and a coaxial shielding fluid;
   an energy source for directing energy at the process fluid to generate emitted energy; and
   an optics system operable to focus the emitted energy on a target.

9. The system of claim 8, wherein the nozzle system comprises a nozzle operable to produce the process fluid and a shell operable to produce the coaxial shielding fluid.

10. The system of claim 9, wherein the shell is constructed of graphite.

11. The system of claim 9, wherein the nozzle is constructed partially or wholly of graphite.

12. The system of claim 9, wherein the nozzle extends through a shell opening in the shell and further comprises a discharge orifice formed between the nozzle and the shell around the perimeter of the shell opening.

13. The system of claim 12, further comprising an adjusting means operable to adjust the nozzle relative to the discharge orifice.

14. The system of claim 12, wherein the discharge orifice is annular.

15. The system of claim 12, wherein the nozzle can be adjusted relative to the discharge orifice.

16. The system of claim 9, wherein the nozzle further comprises a heat exchanger operable to extract heat from or add heat to the nozzle and the shell such that a desired operating temperature range is maintained.

17. The system of claim 16, wherein the nozzle, the shell and the heat exchanger are individually removable from the nozzle system.

18. The system of claim 8, wherein the shielding fluid comprises a noble gas.

19. The system of claim 8, wherein the shielding fluid comprises an inert gas.

20. A method for providing a lithographic light source, comprising:
   providing a fluid system, comprising
      a diffuser,
      a holder assembly, and
      a nozzle system;
   producing a process fluid plume and a coaxial shielding fluid plume from the nozzle system;

targeting an energy source on the process fluid plume to generate emitted energy; and providing an optics system operable to focus the emitted energy.

21. The method of claim 20, further comprising maintaining the nozzle system at a relatively stable temperature.

22. The method of claim 20, wherein the nozzle system comprises a nozzle operable to produce the process fluid and a shell operable to produce the coaxial shielding fluid.

23. The method of claim 22, wherein the nozzle extends through a shell opening in the shell and wherein the nozzle system further comprises a discharge orifice formed between the nozzle and the shell around the perimeter of the shell opening.

24. The method of claim 23, further comprising adjusting the nozzle relative to the discharge orifice.

25. The method of claim 23, wherein the discharge orifice is annular.

26. The method of claim 22, wherein the nozzle system further comprises a heat exchanger operable to produce a heat exchange fluid and further comprising maintaining a temperature of the nozzle system with the heat exchange fluid.

27. The method of claim 26, wherein the nozzle, the shell and the heat exchanger are individually removable from the nozzle system.

* * * * *